(12) United States Patent
Bower et al.

(10) Patent No.: US 6,858,466 B1
(45) Date of Patent: Feb. 22, 2005

(54) SYSTEM AND A METHOD FOR FLUID FILLING WAFER LEVEL PACKAGES

(75) Inventors: Bradley Bower, Junction City, OR (US); Quan Qi, Corvallis, OR (US); Kirby Sand, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/700,713

(22) Filed: Nov. 3, 2003

(51) Int. Cl.[7] .............................................. H01L 21/44
(52) U.S. Cl. ..................... 438/106; 438/127; 257/787
(58) Field of Search ................................ 438/106, 127; 257/787

(56) References Cited

U.S. PATENT DOCUMENTS 6,218,215 B1    4/2001  Distefano et al.
6,611,314 B1    8/2003  Choi et al.
6,621,157 B1    9/2003  Herbst et al.
6,659,116 B1 * 12/2003  Williams et al. ............. 134/176
6,788,477 B2 *  9/2004  Lin ............................ 359/820
2002/0094260 A1 * 7/2002  Coomer et al. ........ 414/416.09

* cited by examiner

Primary Examiner—Luan Thai

(57) ABSTRACT

A fluid filling system includes a vacuum filling chamber configured to receive a wafer, a conduit coupled to the vacuum filling chamber, and a vacuum pump fluidly coupled to the vacuum filling chamber through the conduit, the vacuum pump being configured to create a vacuum within the wafer level packaging cavity, wherein the vacuum filling chamber includes a body having a vacuum orifice, a first substrate sealingly coupled to the body to seal a first end of the vacuum orifice, and a second substrate sealingly coupled to the body to seal a second end of the vacuum orifice.

61 Claims, 14 Drawing Sheets

SYSTEM AND A METHOD FOR FLUID FILLING WAFER LEVEL PACKAGES

BACKGROUND

As integrated circuit (IC) geometries and micro-electro mechanical systems (MEMS) continue to get smaller, the need for reliable high density packaging solutions increases. A promising solution providing reliable packaging for chips of continually decreasing size is wafer level packaging (WLP). WLP is a packaging method in which packaging is formed at the wafer level in an IC foundry or other processing location. WLP allows for testing and burn-in to be performed on a wafer prior to the dicing of the wafer into individual chips.

In certain WLP methods, small cavities or enclosures of an IC or MEMS package may be filled with a fluid. In many such applications, fluid filling of a WLP may need to be performed in such a way as to prevent bubbles or gaseous pockets from forming in the fluid filled cavities. Fluid filling small cavities like those in WLPs without trapping bubbles inside the cavities is a challenge, due to the different relative strengths of various forces at the micro-scale. One such force is surface tension at the surface of a liquid. On the macro scale, surface tension is relatively weak. However, on the micro-scale surface tension may be very strong and even dominate other typically strong forces.

As physical dimensions shrink to the micro-scale, the strength of surface tension on fluids continues to increase relative to other mechanical forces. Surface tension of fluids at the micro level may prevent fluids from flowing into cavities under normal conditions during the fluid filling of wafer level cavities. Traditional equipment used to overcome these surface tensions are expensive and require a large lead time to produce. Furthermore, traditional equipment often experiences cross-contamination when switching between fill fluids. Additionally, traditional fluid filling equipment may not be energy or fill fluid efficient when applied to wafer level filling, further increasing operating costs.

SUMMARY

A fluid filling system includes a vacuum filling chamber configured to receive a wafer, a conduit coupled to the vacuum filling chamber, and a vacuum pump fluidly coupled to the vacuum filling chamber through the conduit, the vacuum pump being configured to create a vacuum within the wafer level packaging cavity, wherein the vacuum filling chamber includes a body having a vacuum orifice, a first substrate sealingly coupled to the body to seal a first end of the vacuum orifice, and a second substrate sealingly coupled to the body to seal a second end of the vacuum orifice.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof. The summary as well as other features and aspects of the present system and method will become apparent upon reading the following detailed description and upon reference to the drawings in which.

Throughout the drawings, identical reference numbers designate similar, but not necessarily identical, elements.

DETAILED DESCRIPTION

Figure 1:
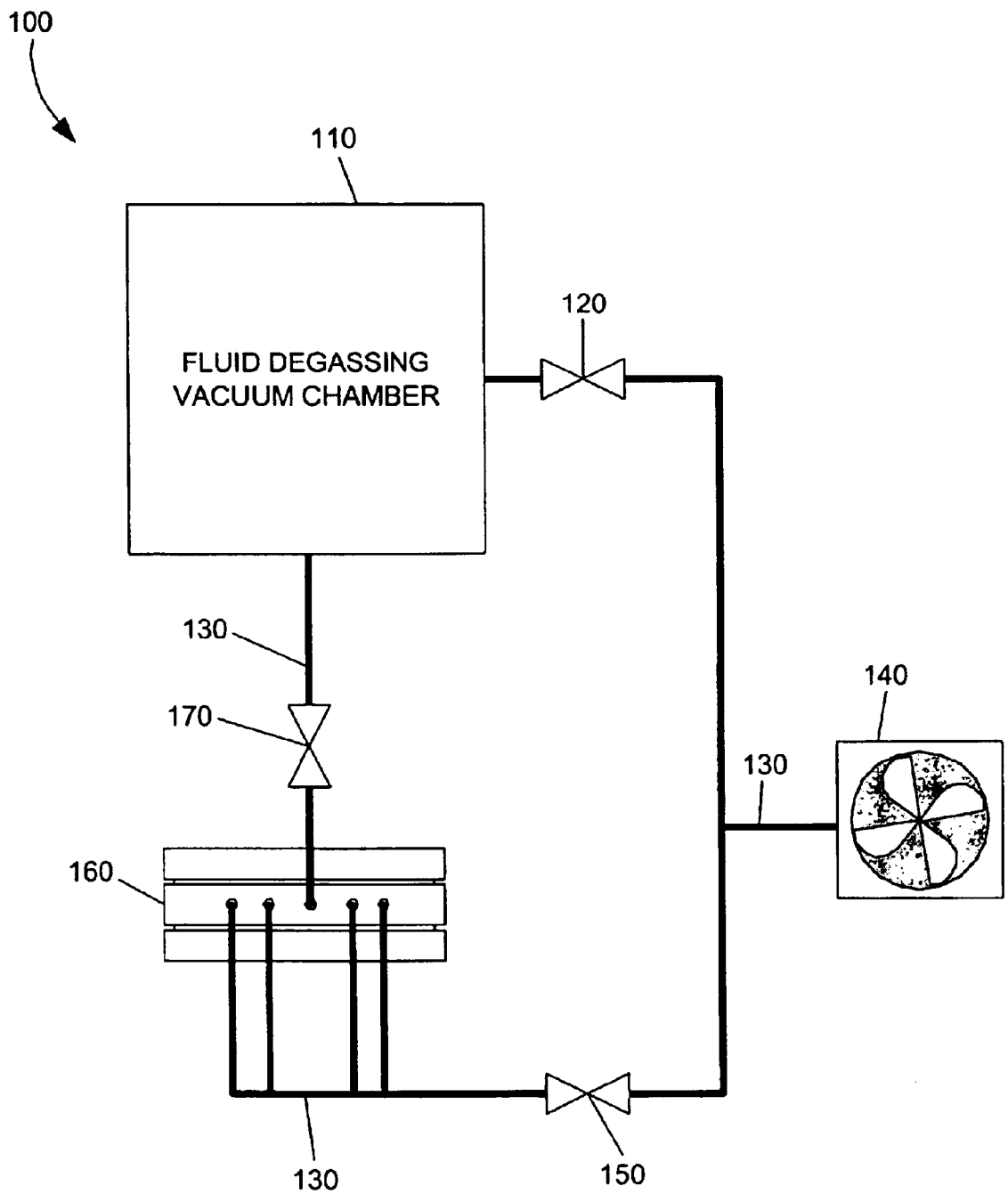
FIG. 1 is a simple block diagram illustrating a system for fluid filling wafer level cavities according to one exemplary embodiment.

The present specification describes a system and a method for fluid filling wafer level packaging cavities. More specifically, the present system and method includes a system and a method for fluid filling wafer level packaging cavities by inducing a vacuum inside wafer level cavities and a surrounding wafer environment, covering the vacuumed cavities with a degassed fluid, and then returning the surrounding wafer environment to atmospheric pressure. This process provides a pressure gradient steep enough to overcome the degassed fluid's surface tension and force the degassed fluid into the wafer level cavities. Once the degassed fluid is inside the wafer level cavities and excess fluid has been removed from the surface of the wafer, the surface tension of the degassed fluid keeps the degassed fluid within the cavities. The following specification and claims disclose exemplary embodiments for performing the above-mentioned process.

As used in this specification and the appended claims, the term "integrated circuit" or "IC" is meant to be understood broadly as describing a semiconductor wafer on which any number of tiny transistors, capacitors, and/or resistors are fabricated, and which may be commonly fabricated using well known IC batch-processing techniques. Exemplary ICs may include, but are in no way limited to, microprocessors, computer memory, amplifiers, oscillators, timers, and counters. The term "Micro-Electro Mechanical System" or "MEMS" is meant to be understood broadly as describing any very small (micro) mechanical device that may be constructed on a single semiconductor chip and which may be fabricated using integrated circuit (IC) batch-processing techniques. MEMS may be broadly classified as sensors, actuators, a combination of sensors and actuators, or added circuitry for processing or control. For the purposes of present specification and appended claims, the term MEMS is meant to refer to any of the above-mentioned classes.

Moreover, the term "package" or "packaging" is meant to be understood broadly as any enclosure or support for an IC or MEMS device. A package or packaging may provide electrical connection and isolation as well as mechanical, thermal, chemical, or optical isolation or passivation in order to protect the function and prolong the life of an IC or MEMS. The terms "fill fluid" and "packaging fluid" are meant to be understood broadly to denote any liquid that may be used to fill cavities or enclosures at the wafer level or in a wafer level packaging scheme. The term "wafer level packaging" or "WLP" is meant to be understood as any IC or MEMS packaging technique in which packaging is formed at the wafer level. Additionally, the term "vacuum" is meant to be understood as a condition in which the pressure of an environment under consideration is lower than ambient atmospheric pressure. The term "vacuum pump" is meant to be understood as any pump configured to produce a vacuum condition in a certain container or environment. The term "degassed" is meant to be understood as a condition in which a fluid may have substantially all dissolved gases removed. A fluid may be degassed by being placed in a hard vacuum that removes substantially all dissolved gasses in the fluid.

In the following specification, for purposes of explanation, numerous specific details are set forth in order to provide a thorough understanding of the present system and method for providing a simple and inexpensive vacuum chamber for fluid filling wafer level packages. It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary structure

FIG. 1 illustrates an exemplary system for filling wafer level packages with fluid according to one exemplary embodiment. As shown in FIG. 1, the fluid filling system (100) includes a vacuum pump (140), a fluid degas chamber (110), and a vacuum chamber (160) fluidly coupled. The vacuum pump (140), the fluid degas chamber (110), and the vacuum chamber (160) are fluidly coupled by a conduit (130). Disposed in the conduit (130) between the vacuum pump (140) and the fluid degassing vacuum chamber is a degas valve (120). Similarly, a vacuum valve (150) is disposed between the vacuum pump (140) and the vacuum chamber (160) while a fluid fill valve (170) is disposed in the conduit (130) between the fluid degas chamber (110) and the vacuum chamber (160). The individual components of the above-mentioned fluid filling system (100) will now be described in further detail below.

The vacuum pump (140) illustrated in FIG. 1 is configured to selectively produce a negative pressure in the conduit (130) and consequently the fluid degassing vacuum chamber (110) as well as the vacuum chamber (160). When activated, the vacuum pump (140) exerts a sufficient negative pressure to evacuate gasses from the conduit (130), the fluid degassing vacuum chamber (110), and/or the vacuum chamber (160). The vacuum pump (140) may be any vacuum producing apparatus including, but in no way limited to, a high vacuum pump, a rotary vane vacuum pump, a turbo-molecular pump, or a piston vacuum pump. Moreover, while the present fluid filling system (100) is described in the context of incorporating a single vacuum pump (140), any number of vacuum pumps (140) may be incorporated in the present system and method.

As shown in FIG. 1, the vacuum pump (140) is fluidly coupled to the fluid degassing vacuum chamber (110) through the conduit (130). The fluid degassing vacuum chamber (110) may be any container configured to house any number of fluids and facilitate the degassing of those fluids. When the vacuum pump (140) is allowed to exert a negative pressure on the degassing vacuum chamber (110), any fluids contained within the degassing vacuum chamber (110) experience a reduced pressure above their surface. This reduced pressure allows for the escape and subsequent removal of entrapped air and other gasses that could induce failure of the present system and method. The present degassing vacuum chamber (110) may be constructed of any number of materials that may be sealed and not collapse under the vacuum induced by the vacuum pump (140) including, but in no way limited to, plastic, glass, metal, composites, or ceramic.

As shown in FIG. 1, a degas valve (120) may be disposed in the conduit (130) between the vacuum pump (140) and the fluid degassing vacuum chamber (110). The degas valve (120) is configured to selectively couple the vacuum pump and the fluid degassing vacuum chamber (110). When the degas valve (120) is closed, any drop in pressure generated by the vacuum pump (140) will not be transmitted to, nor affect the pressure in the fluid degassing vacuum chamber (110). However, when the degas valve (120) is opened, the vacuum pump (140) is in fluid communication with the fluid degassing vacuum chamber (110) and a degassing process may be performed on a fluid contained within the fluid degassing vacuum chamber. The degas valve (120) may be manually or remotely operated and may include, but is in no way limited to, a gate valve, a globe valve, a diaphragm valve, a needle valve, or a plug valve. In an automated arrangement that provides remotely operated valves, sensors may monitor vacuum levels and the degree to which a fluid is degassed. A computing device may also be coupled to the remotely operated valves, configured to open and close valves based on such measurements, yielding a partially or fully automated wafer level fluid filling system.

Similar to the degas valve (120), a vacuum valve (150) and a fluid fill valve (170) may be disposed in the conduit (130). As shown in the exemplary embodiment illustrated in FIG. 1, the vacuum valve (150) may selectively regulate the fluid coupling between the vacuum pump (140) and the vacuum filling chamber (160). Similarly, the fluid fill valve may regulate the flow of degassed fluid between the fluid degassing vacuum chamber (110) and the vacuum filling chamber (160). As noted above with respect to the degas valve, the vacuum valve (150) and the fluid fill valve (170) may be manually or remotely controlled and may include, but are in no way limited to, a gate valve, a globe valve, a diaphragm valve, a needle valve, or a plug valve.

The conduit (130) illustrated in FIG. 1, allows gases or liquids to flow between components of the present fluid filling system (100). The conduit (130) coupling the components of the present fluid filling system may be, but are in no way limited to, polymer or metal based pipes of varying diameters.

Coupled to both the fluid degassing vacuum chamber (110) and the vacuum pump (140) is the vacuum filling chamber (160). The vacuum filling chamber is configured to inexpensively fill a wafer level package with fluid. Individual components of the present vacuum filling chamber (160) will be explained below with reference to FIG. 2 and FIG. 3.

Figure 2:
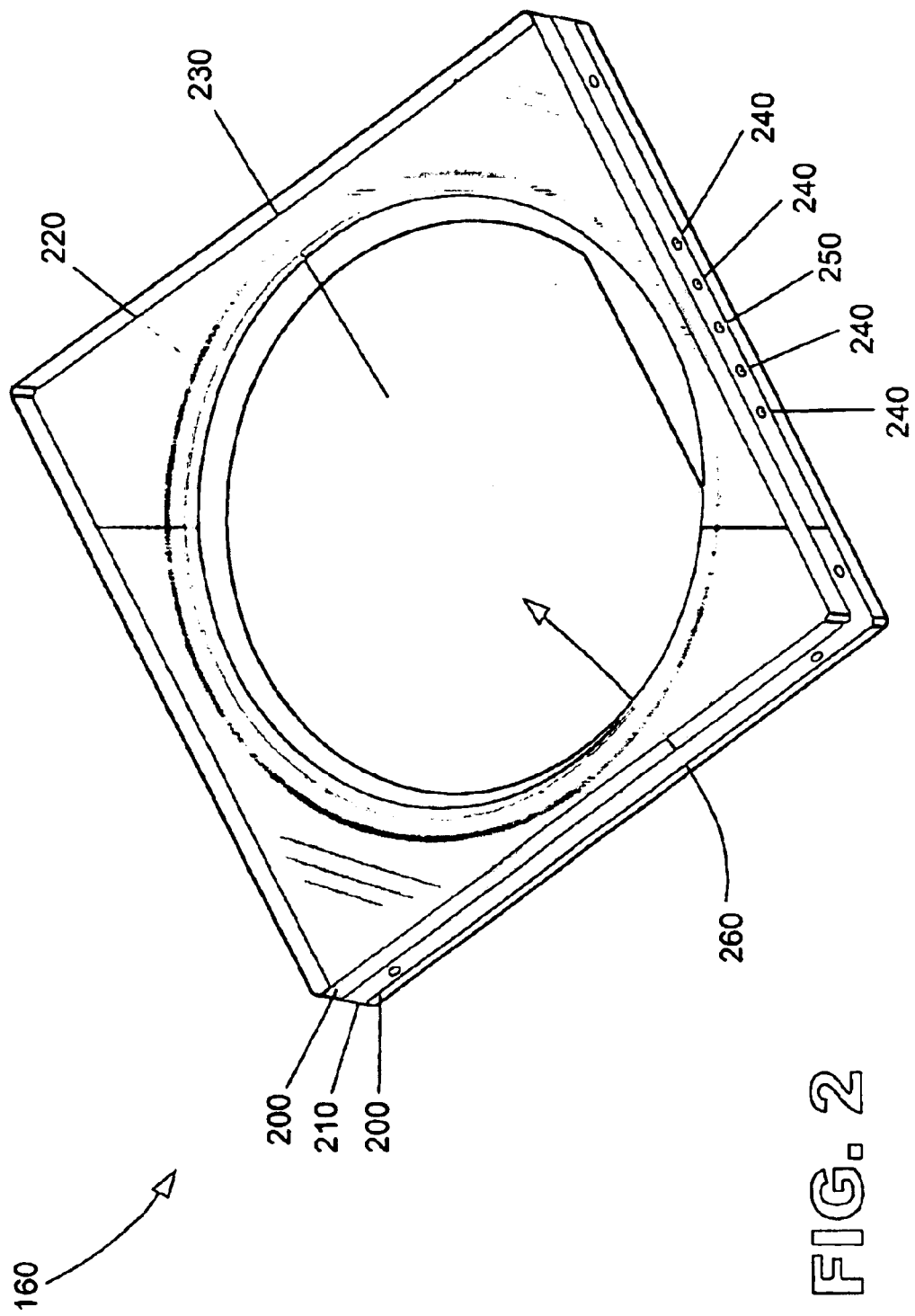
FIG. 2 is an assembled view of a vacuum chamber according to one exemplary embodiment.

FIG. 2 illustrates an assembled vacuum filling chamber configured to inexpensively fill a wafer level package with fluid according to one exemplary embodiment. As shown in FIG. 2, the vacuum filling chamber (160) may include glass plates (200) at opposing ends of the vacuum filling chamber (160) and a body plate (210) disposed between the glass plates (200). The body plate (210) also includes a vacuum orifice (260) configured to house a wafer (230). O-rings or other seals (220) may separate and form a vacuum seal between the glass plates (200) and the body plate (210). One or more fluid ports (250) may provide a channel through the body plate (210) and into the vacuum chamber (160). Additionally, one or more vacuum ports (240) may also provide lumens extending through the body plate (210) and into the vacuum orifice (260).

Figure 3:
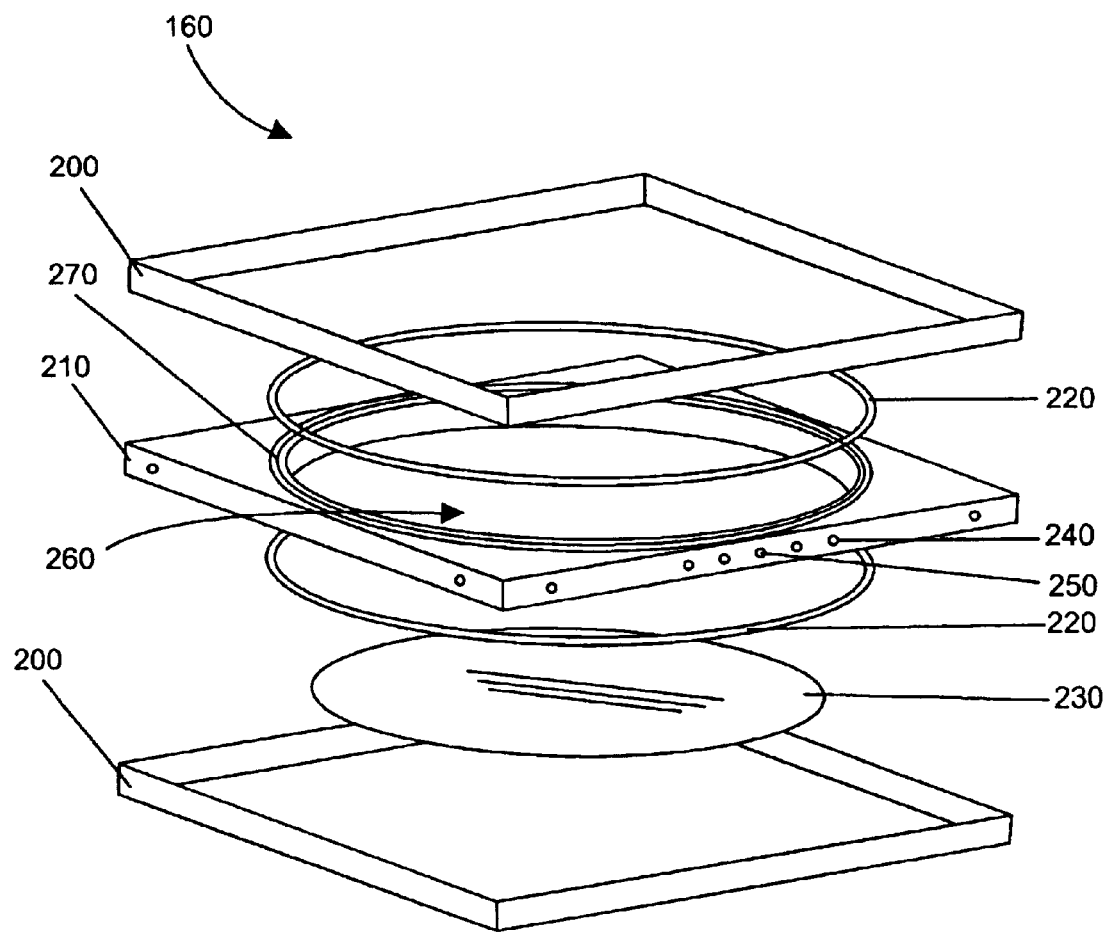
FIG. 3 is an exploded view of a vacuum chamber to be incorporated in a system for fluid filling wafer level cavities according to one exemplary embodiment.

Turning now to FIG. 3, an exploded view of the vacuum chamber (160) is illustrated according to one exemplary embodiment. As shown in FIG. 3, the present vacuum filling chamber (160) includes a plurality of glass plates (200) disposed on each end of the vacuum filling chamber. The glass plates illustrated in FIG. 3 are planar, however, the glass plates (200), as well as the body plate (210) may assume any number of profiles including, but in no way limited to, curved surfaces. The glass plates (200) incorporated on each end of the vacuum chamber (160) may be made of any transparent, relatively strong, hard-wearing, essentially inert, and biologically inactive material which can be formed with very smooth and impervious surfaces.

Disposed between the glass plates (200) is a body plate (210). The body plate may be constructed from any number of materials including, but in no way limited to, metals, composites, ceramics, or plastics. As shown in FIG. 3, the body plate (210) may include a vacuum orifice (260), one or more vacuum ports (240), one or more fluid ports (250), and a seal receiving groove (270).

The vacuum orifice (260) disposed in the central body plate (210) is configured to house one or more wafers (230) or wafer level packages. The vacuum orifice (260) is disposed in the body plate to provide a location for the fluid filling of the wafer packages. The vacuum orifice (260) is in fluid communication with both the one or more vacuum ports (240) and the one or more fluid ports (250). The one or more vacuum ports (240) fluidly couple the vacuum orifice (260) to the conduit (130; FIG. 1) and subsequently the vacuum pump (140; FIG. 1). It is via the vacuum ports (240) that the vacuum orifice (260) is evacuated of all gas to facilitate the present fluid filling method according to one exemplary embodiment.

Similarly, the one or more fluid ports (250) fluidly couple the fluid degassing vacuum chamber (110; FIG. 1) to the vacuum orifice (260). This fluidic coupling allows the fluid degassing vacuum chamber (110; FIG. 1) to selectively dispose degassed fluid into the vacuum orifice (260) according to one exemplary embodiment.

The seal receiving groove (270) is disposed in the central body plate (210) to seat and retain an o-ring or other seal (220) between the glass plates (200) and the body plate (210). By maintaining the o-ring or other seal (220) between the glass plates (200) and the body plate (210), a fluidly sealed volume may be selectively created in the vacuum orifice (260).

Exemplary Implementation and Operation

Figure 4:
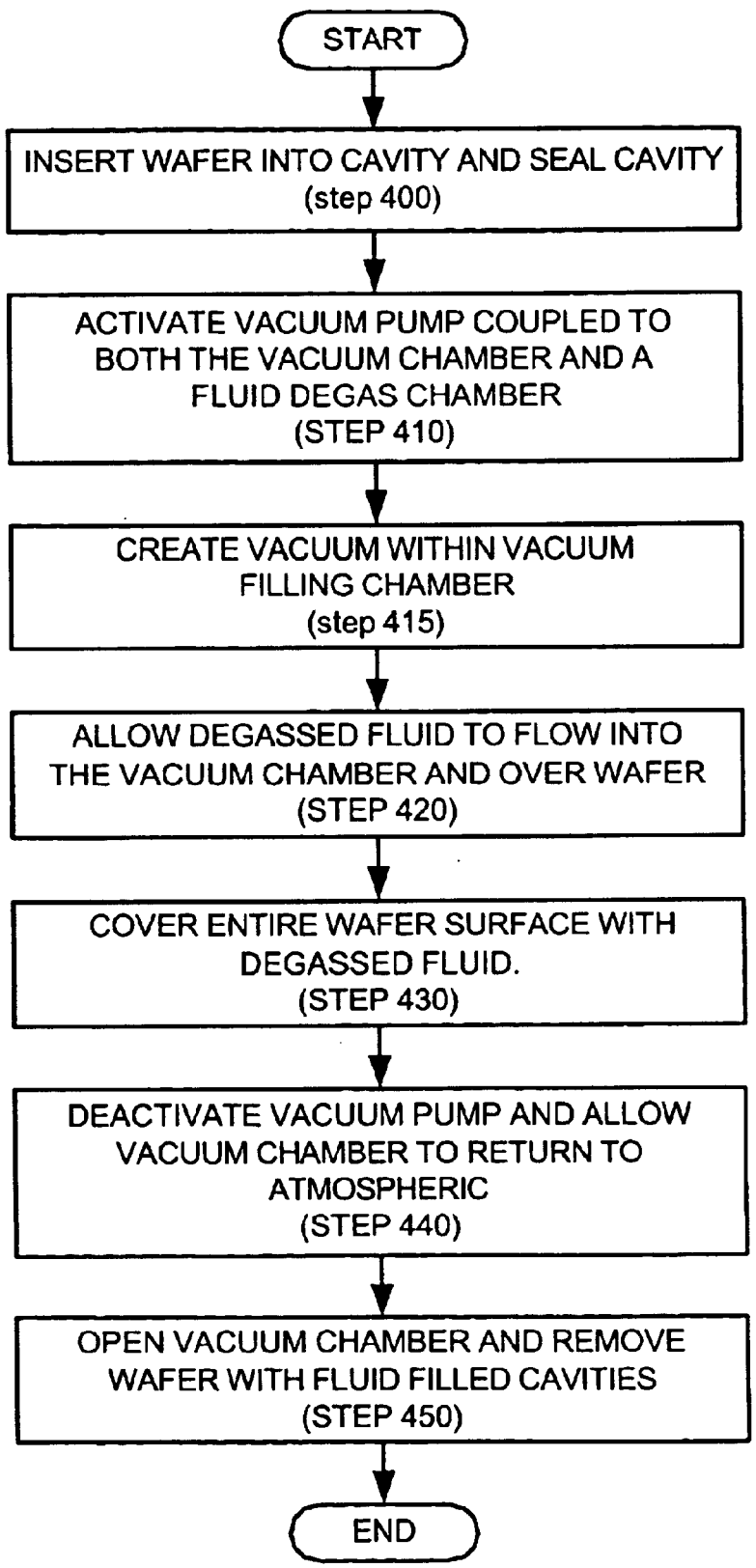
FIG. 4 is a flowchart illustrating a method of operating a system for fluid filling wafer level packaging cavities according to one exemplary embodiment.

Referring now to FIG. 4, a flowchart illustrating an exemplary method for operating a system for fluid filling wafer level packaging cavities is shown. As shown in FIG. 4, the process may begin when a wafer is placed inside the vacuum orifice and the vacuum orifice is sealed (step 400). Once the orifice is sealed, the vacuum pump (140; FIG. 1) is activated (step 410). The vacuum valve is then opened and a vacuum is created within the vacuum filling chamber (step 415). When the vacuum condition exists within the vacuum filling chamber, degassed fluid is allowed to flow into the vacuum filling chamber (step 420), thereby covering the entire wafer surface with degassed fluid (step 430). Once the entire wafer surface is covered with degassed fluid, the pump is deactivated and the vacuum filling chamber is allowed to return to atmospheric pressure (step 440). When the chamber is at atmospheric pressure, the vacuum filling chamber may be opened and the wafer containing the fluid filled cavities may be removed (step 450). The above-mentioned method will be described in further detail below with reference to FIG. 5 through FIG. 10.

Figure 5:
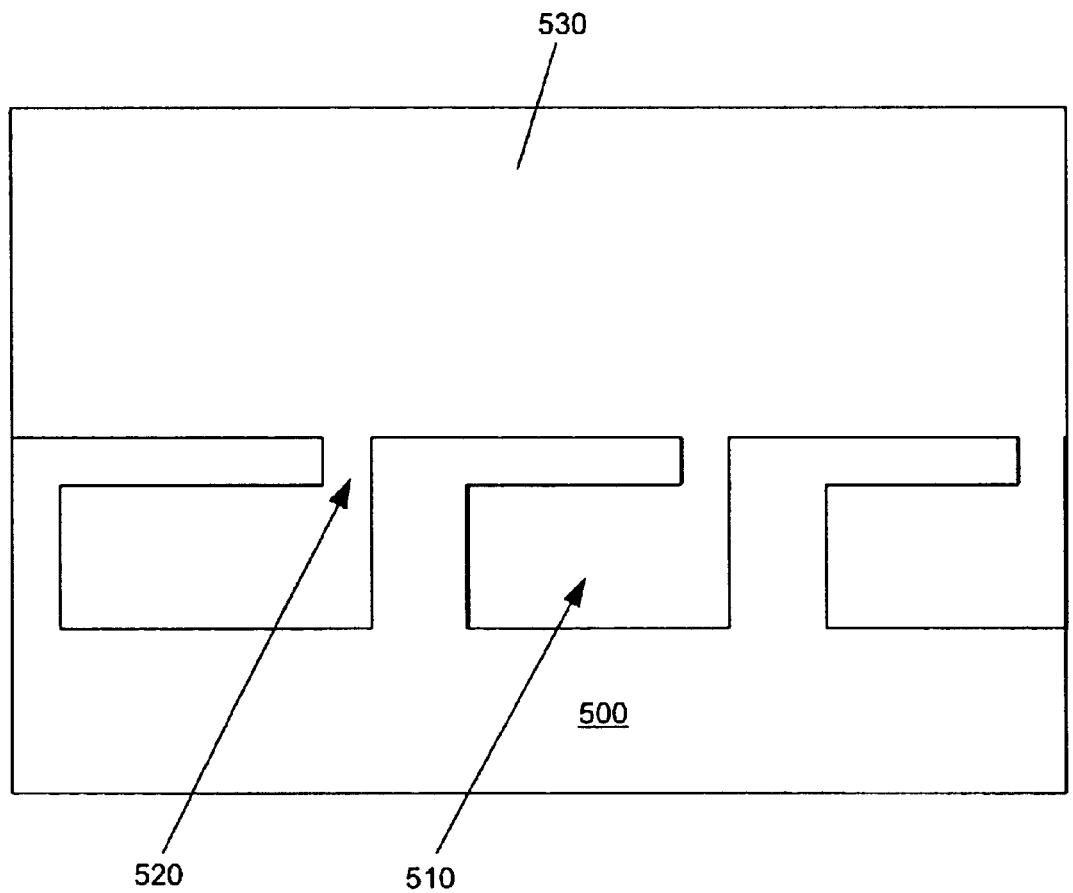
FIG. 5 illustrates a magnified, cross-sectional view of a wafer inside a vacuum chamber according to one exemplary embodiment.

As indicated above, the present method begins when a wafer is inserted into the vacuum orifice and the vacuum orifice is sealed (step 400). FIG. 5 illustrates an exemplary embodiment of a wafer (500) being inserted into the vacuum orifice (260; FIG. 2) of the present system. As shown in FIG. 5, a silicon wafer or other semiconductor material having wafer-level cavities (510) may be disposed inside the vacuum orifice (260; FIG. 2) of the vacuum chamber (160; FIG. 1). The wafer-level cavities (510) may have access to the surface of the wafer (500), and consequently the surrounding atmosphere, via a number of fill ports (520). The cavities (510) and/or fill ports (520) may or may not be of similar dimensions depending on the wafer design. While the present exemplary embodiment is explained in the context of fluid filling a silicon wafer, the present system and method may be used to fluidly fill any number of wafer level packages including, but in no way limited to, a wafer containing MEMS etched thereon.

As shown in FIG. 5, the vacuum chamber environment may contain air (530) or any other gas contained at atmospheric pressure prior to the activation of the vacuum pump (140; FIG. 1). Due to the fill ports (520) providing access to the cavities (510), the wafer level cavities (510) may also be filled with air (530) at atmospheric pressure. Once the wafer (500) is placed inside the vacuum orifice (260; FIG. 2) of the vacuum chamber (160; FIG. 1), the vacuum chamber (160; FIG. 1) may be sealed (step 400; FIG. 4) by compressing the glass plates (200; FIG. 2) against the body plate (210; FIG. 2) having the o-ring (220; FIG. 2) form a seal.

Once the wafer (500) is inserted and the vacuum chamber (160; FIG. 1) is fluidly sealed (step 400; FIG. 4), the vacuum pump (140; FIG. 1) that is coupled to both the simple vacuum filling chamber (160; FIG. 1) and the fluid degassing vacuum chamber (110; FIG. 1) may be activated (step 410; FIG. 4) thereby creating a vacuum within the vacuum filling chamber (step 415; FIG. 4). Once activated, the vacuum pump may simultaneously degas the fluid in the fluid degas chamber (110; FIG. 1) and evacuate the vacuum chamber (160; FIG. 1). The degree to which the fluid is degassed and the level of vacuum in the vacuum chamber may be monitored by system sensors (not shown). In an alternative embodiment the degree to which fluid is degassed and the strength of vacuum in the vacuum chamber may be assumed based on previously tested operating parameters and times. In any case, the vacuum pump (140; FIG. 1) may be left running until an acceptable degree of fluid degassing has been accomplished in the fluid degas chamber (110; FIG. 1) and an acceptable vacuum has been reached in the vacuum chamber (160; FIG. 1), according to design tolerances. In an alternative embodiment automated controllers may be provided to automate the process of opening and closing valves, activating and deactivating the vacuum pump, and operating other system processes based on sensor output. For ease of explanation only the present treatment considers an embodiment in which system processes are manually controlled.

Figure 6:
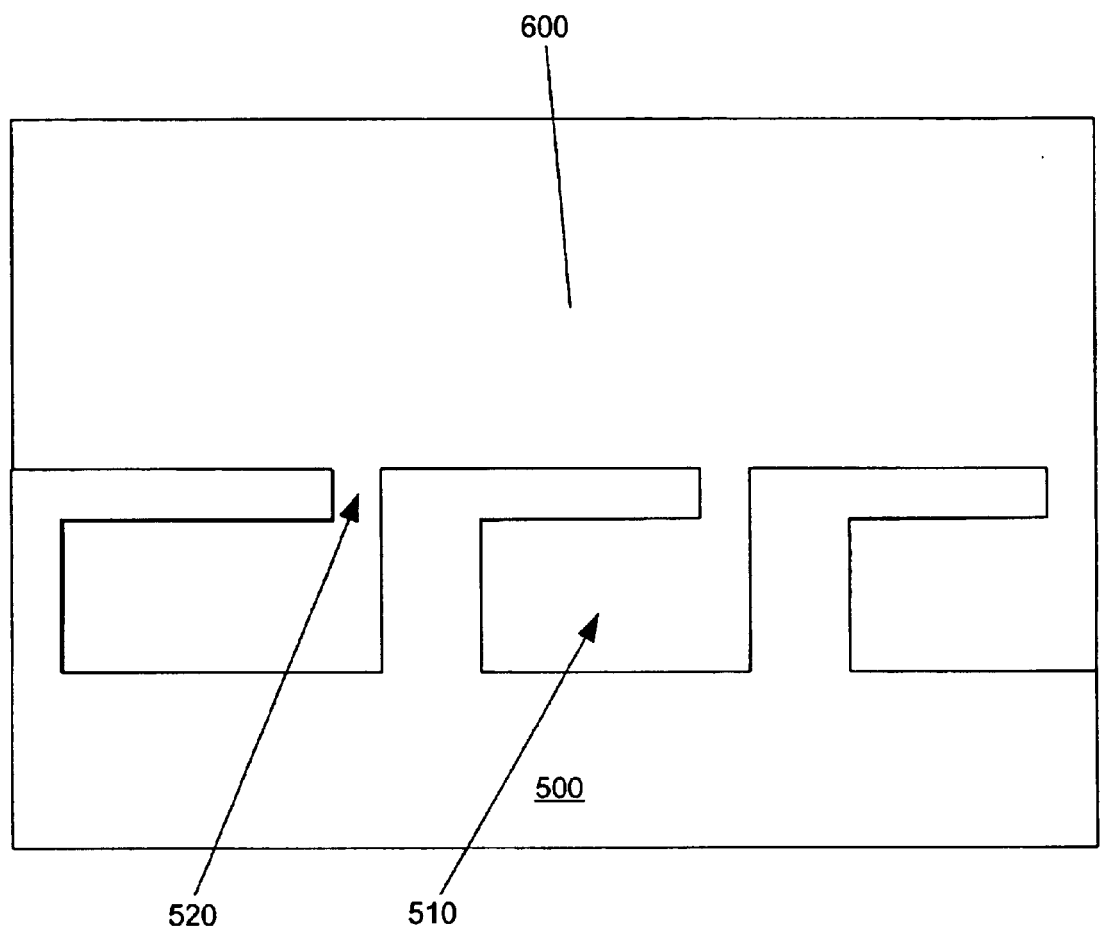
FIG. 6 illustrates a magnified, cross-sectional view of an evacuated wafer inside a vacuum chamber according to one exemplary embodiment.

FIG. 6 illustrates a wafer (500) contained within the simple vacuum filling chamber (160; FIG. 1) after the vacuum pump (140; FIG. 1) has been activated and a vacuum (600) is created in the vacuum orifice (260; FIG. 2). Once the vacuum pump (140; FIG. 1) has been activated, it substantially decreases the pressure in the conduit (130; FIG. 1). Consequently, the pressure may also be decreased in the fluid degassing vacuum chamber (110; FIG. 1) and the simple vacuum filling chamber (160; FIG. 1) if the appropriate valves (120, 150; FIG. 1) are opened. By opening the degas valve (120; FIG. 1) while the vacuum pump (140; FIG. 1) is operating, fluid contained within the fluid degassing vacuum chamber (110; FIG. 1) may be degassed due to a reduction in pressure. Similarly, if the vacuum valve (150; FIG. 1) is opened while the vacuum pump (140; FIG. 1) is in operation, air (530; FIG. 5) or any other gas contained in the vacuum filling chamber (160; FIG. 1) may be evacuated resulting in a vacuum environment (600) both surrounding the wafer (500) and within the cavities (510). The vacuum pump (140; FIG. 1) may be left on until both the fluid within the fluid degassing vacuum chamber (110: FIG. 1) is degassed and a desired vacuum level has been reached in the vacuum chamber (160; FIG. 1).

Once a system operator or monitoring system has determined that both the vacuum chamber (160; FIG. 1) is sufficiently evacuated and that the fluid in the fluid degas chamber (110; FIG. 1) is sufficiently degassed, the fluid fill valve (170; FIG. 1) may be opened. Once the fluid fill valve (170; FIG. 1) has been opened, degassed fluid may flow into the vacuum chamber (160, FIG. 1) through one or more fluid fill ports (250; FIG. 2) and onto the wafer (step 420; FIG. 4). During this fluid filling process, the vacuum valve (150; FIG. 1) and degas valve (120; FIG. 1) may either be left open or closed. The fluid degas chamber may be coupled to the vacuum chamber in such a way as to allow gravity to cause the fluid to flow into the vacuum chamber and over the wafer. Alternatively, another mechanism, such as a pump, may be employed to cause the fluid to flow from the degas chamber into the vacuum chamber via the fluid ports (250; FIG. 2). A quantity of degassed fluid sufficient to cover the entire wafer surface may be allowed to flow into the vacuum chamber (160; FIG. 1) before the fluid fill valve (170; FIG. 1) is shut. Similarly, an amount of time sufficient to allow the fluid to spread across the surface of the wafer may be allowed to transpire before the valve is shut.

Figure 7:
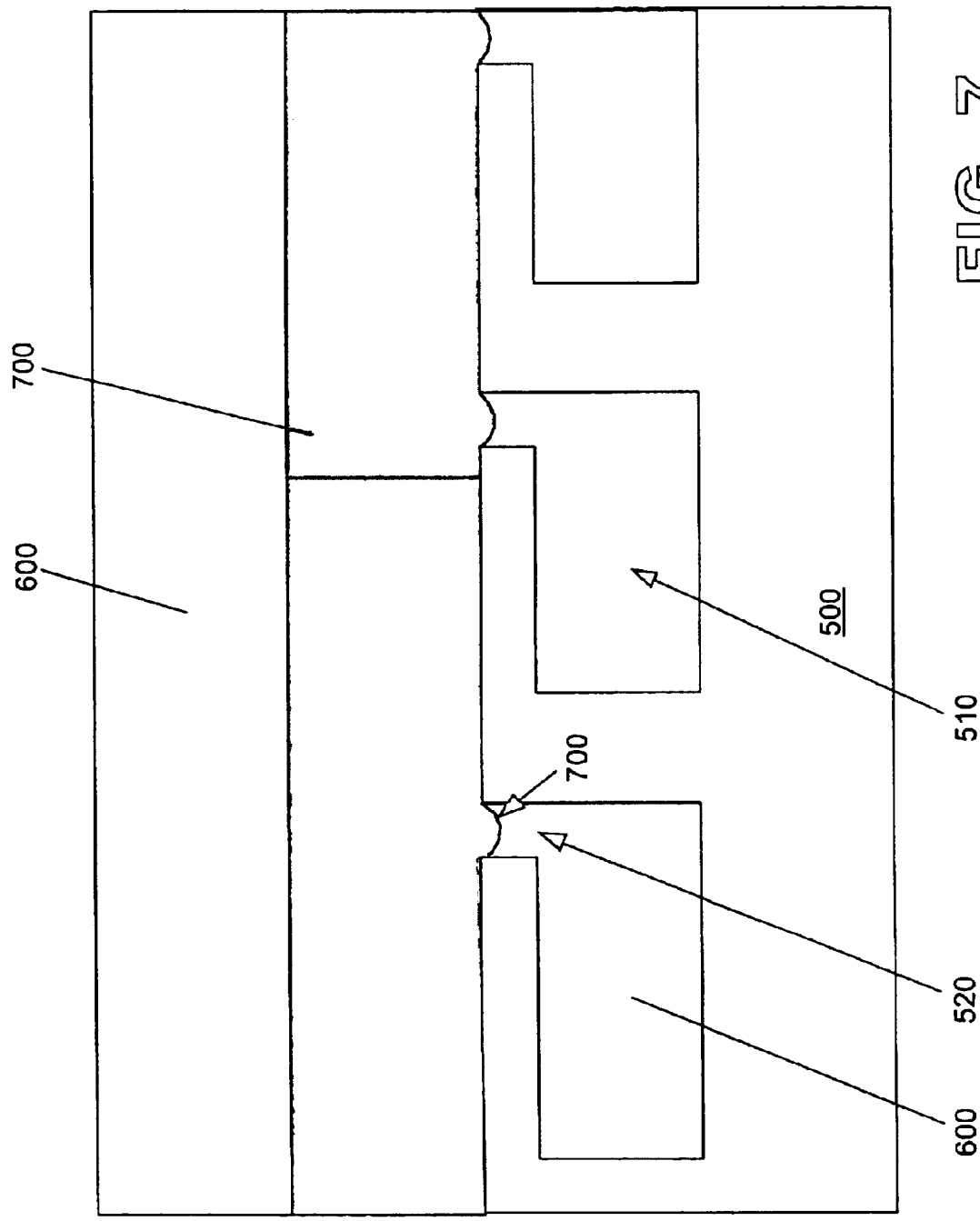
FIG. 7 illustrates a magnified, cross-sectional view of an evacuated wafer including degassed fluid inside a vacuum chamber according to one exemplary embodiment.

FIG. 7 illustrates a cross-sectional view of the silicon wafer (500) inside the vacuum chamber (160; FIG. 1) after the fluid fill valve (170; FIG. 1) has been opened and degassed fluid (700) has flowed into the vacuum chamber (160; FIG. 1) and over the silicon wafer (500). As shown in FIG. 7, the degassed fluid (700) may spread across the wafer in a substantially uniform layer due to gravity. In an alternative embodiment, the wafer (500) or the vacuum chamber (160; FIG. 3) itself may be spun in order to cause the degassed fluid (700) to cover the surface of the wafer (500) uniformly. In either case, an operator may allow enough degassed fluid (700) to flow into the vacuum chamber (160; FIG. 1) and enough time to elapse in order for the wafer (500) to be substantially covered in a layer of degassed fluid (step 430; FIG. 4). Due to the relative strength of fluid surface tension on the micro-scale, and due to the small size of wafer fill ports (520), surface tension may prevent degassed fluid (700) from flowing into the fill ports (520) and subsequently filling the wafer level cavities (510). Rather, degassed fluid (700) may largely remain near the opening of the wafer level cavity fill ports (520) at the surface of the wafer (500) as shown in FIG. 7. A vacuum (600) condition may remain both inside the wafer level cavities (510) and inside the vacuum chamber (160; FIG. 1) in general.

After the wafer (500) has been sufficiently covered with degassed fluid (700), the vacuum pump (140; FIG. 1) may be deactivated while the vacuum valve (150) remains open, gradually returning the air pressure inside the vacuum chamber (160; FIG. 1) to atmospheric pressure (step 440; FIG. 4). As air and/or other gasses are gradually allowed to flow into the vacuum chamber, the general pressure of the vacuum chamber (160; FIG. 1) may return to atmospheric pressure over the degassed fluid and wafer. However, the crevices and cavities in the wafer not filled with degassed fluid may still experience a hard vacuum condition. Consequently, as pressure in the vacuum chamber returns to atmospheric pressure, a steep pressure gradient develops between the general vacuum chamber atmosphere and the vacuumed wafer level cavities. As a result of the pressure gradient, degassed fluid (700) disposed over the cavity fill ports (520) in the wafer (500) may be forced through the fill ports (520) and into the wafer-level cavities (510) maintained in vacuum (600).

Figure 8:
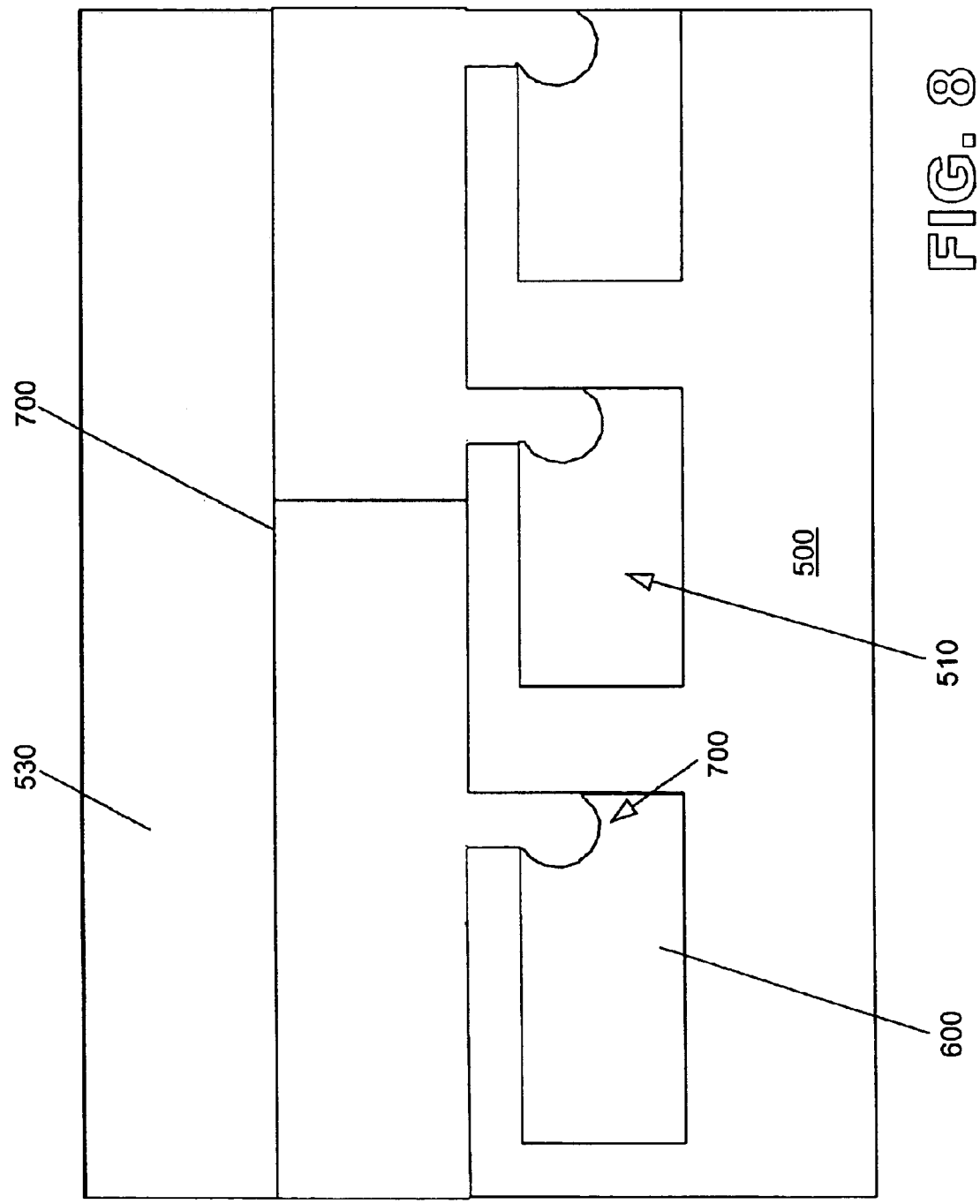
FIG. 8 illustrates a magnified, cross-sectional view of a wafer and degassed fluid inside the vacuum chamber after pressure has been returned to atmospheric according to one exemplary embodiment.

FIG. 8 illustrates a cross-sectional view of a wafer (500) in the vacuum chamber environment after the vacuum pump (140; FIG. 1) has been deactivated and after air pressure inside the vacuum chamber (160; FIG. 1) has returned to atmospheric pressure. When pressure inside the vacuum chamber (160; FIG. 1) in general has returned to atmospheric pressure, a condition is established in which a steep pressure gradient is set up from the vacuum chamber atmosphere (530) (at atmospheric pressure) to the wafer level cavities (510) (which, sealed from the vacuum chamber atmosphere by degassed fluid (700), may remain in a hard vacuum condition). This strong pressure gradient may force degassed fluid (700) to flow through wafer fill ports (520) and into wafer level cavities (510).

Figure 9:
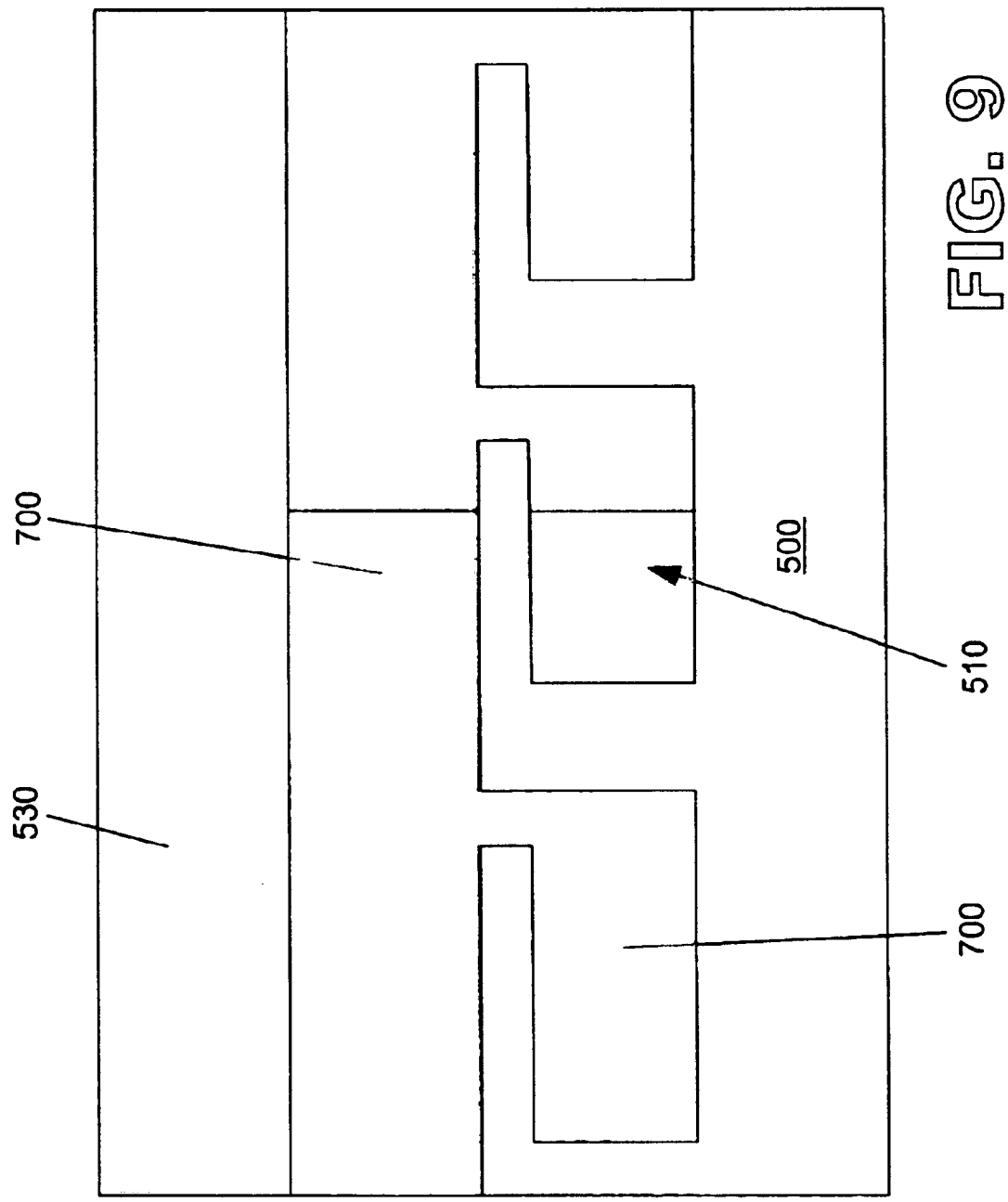
FIG. 9 illustrates a magnified, cross-sectional view of a wafer filled with degassed fluid according to one exemplary embodiment.

FIG. 9 illustrates a magnified, cross-sectional view of the wafer (500) inside the vacuum chamber (160; FIG. 1) after air pressure inside the vacuum chamber (160; FIG. 1) has returned to atmospheric and after sufficient time has elapsed to allow degassed fluid (700) to flow into and fill wafer level cavities (510). Given sufficient time, degassed fluid may substantially fill wafer level cavities (510) and the former pressure gradient may no longer exist. Air (530) or another gas may fill the vacuum chamber (160; FIG. 1) at atmospheric pressure and a layer of degassed fluid (700) may still cover the surface of the wafer (500). At this point the vacuum chamber (160; FIG. 1) may be opened and the wafer (500) with fluid filled wafer level cavities (510) may be removed from the vacuum chamber (160; FIG. 1) of the present system for cleaning and further processing (step 450; FIG. 4).

Figure 10:
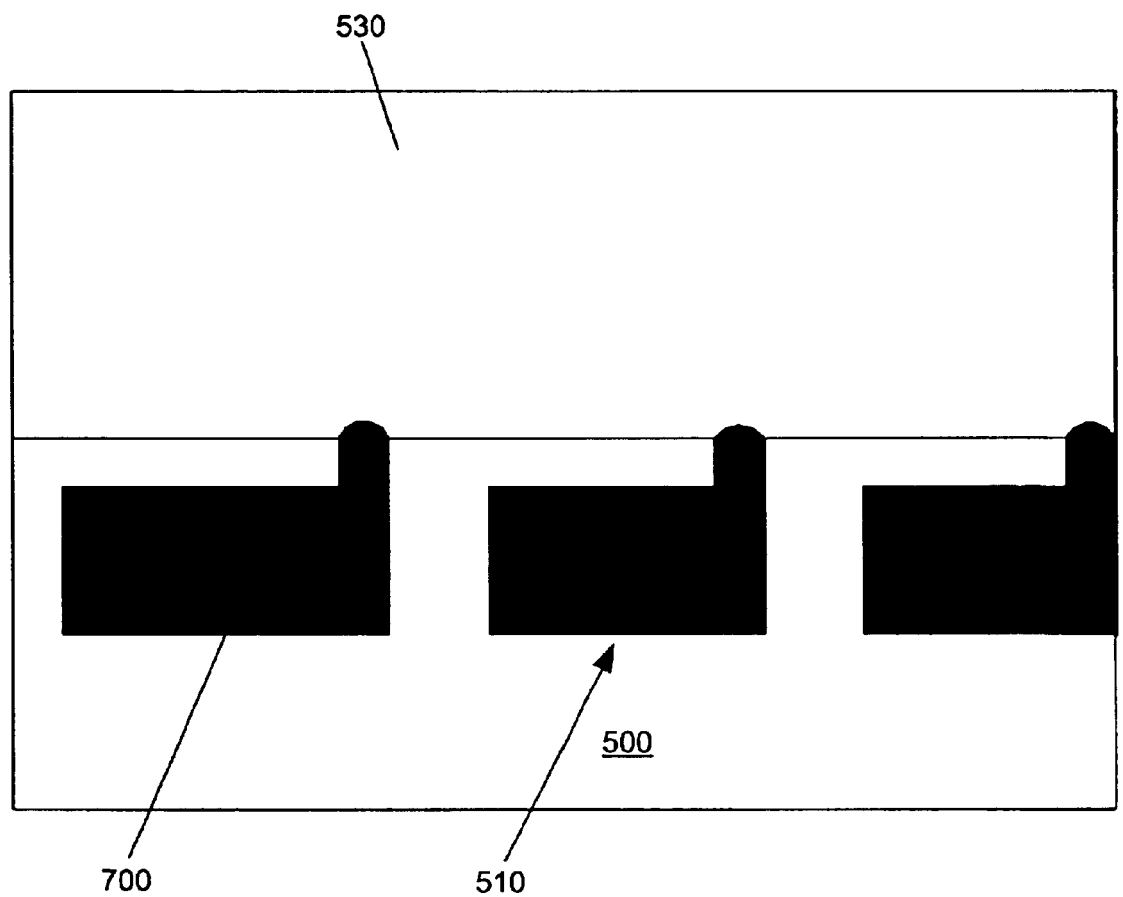
FIG. 10 is a magnified, cross-sectional view of a fluid filled wafer after excess degassed fluid has been removed, according to one exemplary embodiment.

FIG. 10 illustrates a magnified, cross-sectional view of the wafer (500) outside the present system after excess degassed fluid (700) has been removed. Excess degassed fluid may be removed from the surface of the wafer (500) by a number of different methods. According to one exemplary embodiment, the excess degassed fluid (700) may be washed off using deionized water or another appropriate solution under high pressure. In another exemplary embodiment, excess degassed fluid may be removed mechanically, either manually or by an automated process, by rubbing the surface of the silicon wafer (500) with a cloth or other absorptive material. Although many different methods for excess fluid removal are possible, the wafer level cavities (510) may remain filled with degassed fluid. The surface tension, which initially resisted introduction of fluid into the cavities, now resists removal of fluid from the filled wafer level cavities (510). Depending upon design parameters, the fluid may be hermetically sealed within the wafer level cavities (510), providing a fluid filled wafer level package.

The system (100; FIG. 1) for fluid filling wafer level cavities described above is advantageous due to its simplicity of design. Unlike traditional fluid filling systems, the present fluid filling system (100; FIG. 1) may be quickly manufactured due to its simplicity of design. The present system's simplicity of design may also allow relatively simple and complete disassembly, thereby providing the possibility of thorough cleaning not available to LCD fluid filling machines. Such thorough cleaning may allow for the substantial elimination of cross-contamination of fill fluids when one fill fluid is changed for another, making the present system adaptable to fluid filling for various IC and MEMS package designs.

Additionally, the simple design of the present system (100; FIG. 1) may allow it to be used with commercially available vacuum pumps and other components already on the market without the need to design new components, thereby decreasing the cost of manufacturing and maintaining the present system (100; FIG. 1). Simplicity of design also leads to a physically smaller fluid filling unit that may easily be moved by a single person when needed, rather than necessitating the use of cranes or other equipment which may be necessary to move traditionally bulky, complex fluid filling machines.

Furthermore, the present system may be more energy and fluid efficient than traditional fluid filling machines. The relatively small vacuum orifice (260; FIG. 2) may prove easier to evacuate for a vacuum pump or an array of pumps than a larger vacuum chamber traditionally used by other systems, thereby providing more efficient per wafer energy consumption. Moreover, the consumption of fill fluid may be more efficient in the present system (100; FIG. 1) than traditional system's fluid consumption. Fill fluid consumption may be exceptionally efficient in embodiments where the wafer or the vacuum chamber itself is spun as will be explained below with regards to alternative embodiments of the present system and method.

ALTERNATIVE EMBODIMENTS

Figure 11:
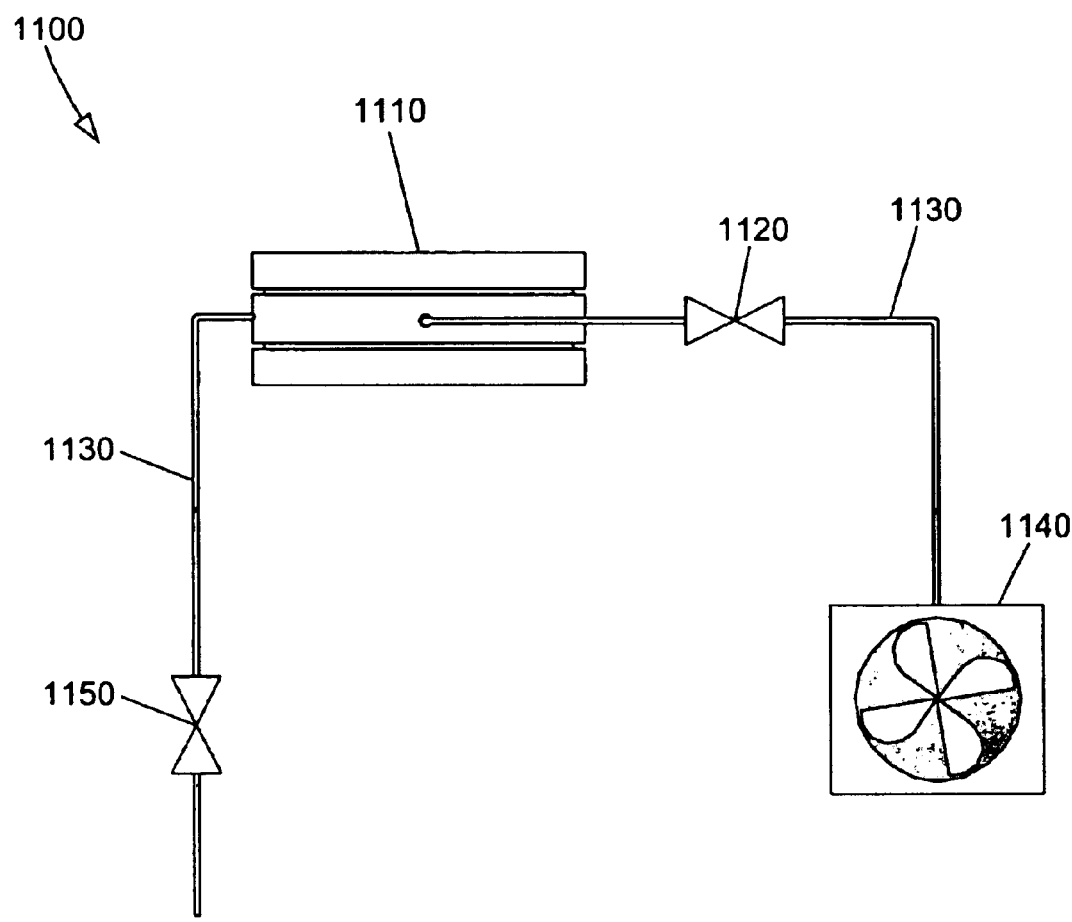
FIG. 11 illustrates an alternative system for fluid filling wafer level cavities according to one exemplary embodiment.

FIG. 11 illustrates an alternative system for filling wafer level packages with fluid according to one exemplary embodiment. As shown in FIG. 11, the fluid filling system (1100) includes a vacuum pump (1140) coupled to a simple vacuum filling chamber (1110) through a conduit (1130). Additionally, a vacuum valve (1120) and a fluid drain valve (1150) are disposed in the conduit.

Similar to the embodiment illustrated in FIG. 1, the vacuum pump (1140) illustrated in FIG. 11 is configured to selectively produce a negative pressure in the conduit (1130) and consequently the simple vacuum filling chamber (1110). When activated, the vacuum pump (1140) exerts a sufficient negative pressure to evacuate gasses from the conduit (130) and/or the simple vacuum filling chamber (1110). The vacuum pump (1140) may be any vacuum producing apparatus including, but in no way limited to, a high vacuum pump, a rotary vane vacuum pump, a turbo-molecular pump, or a piston vacuum pump. Moreover, while the present fluid filling system (1100) is described in the context of incorporating a single vacuum pump (1140), any number of vacuum pumps (1140) may be incorporated in the present system and method.

The conduit (1130) couples the vacuum pump (1140) to the vacuum filling chamber (1110). Disposed in the conduit (1130) between the vacuum pump (1140) and the vacuum filling chamber (1110) is a vacuum valve (1120). The vacuum valve (1120) is configured to selectively couple the vacuum pump (1140) to the vacuum filling chamber (1110). The vacuum valve (1120) may be manually or remotely controlled and may include, but is in no way limited to, a gate valve, a globe valve, a diaphragm valve, a needle valve, or a plug valve.

Exiting the vacuum filling chamber (1110) is a series of conduit (1130) containing a fluid drain valve (1150). The fluid drain valve (1150) is configured to selectively permit the draining of excess fluid from the vacuum filling chamber (1110).

Figure 12:
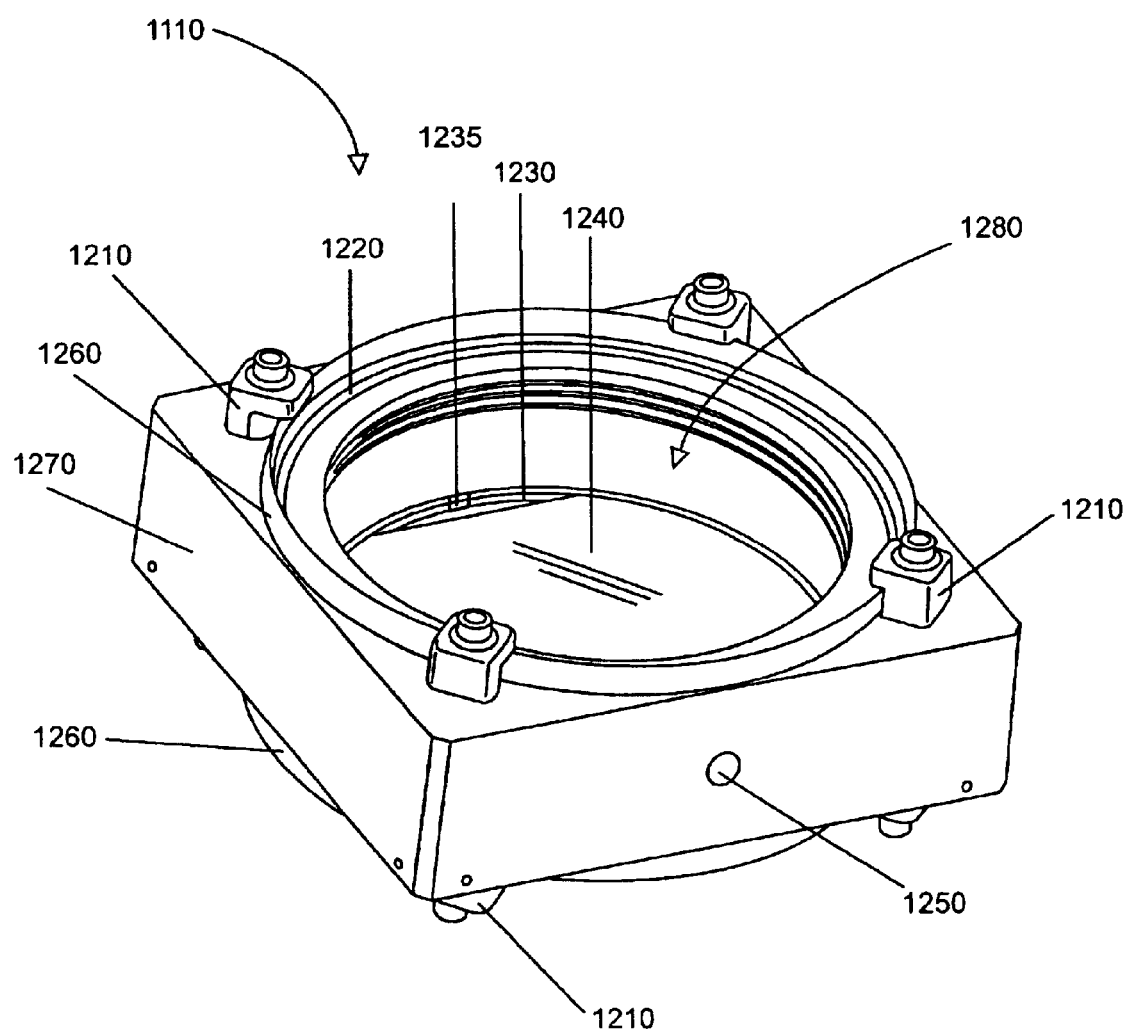
FIG. 12 illustrates an assembled view of a vacuum chamber according to one exemplary embodiment.
Figure 13:
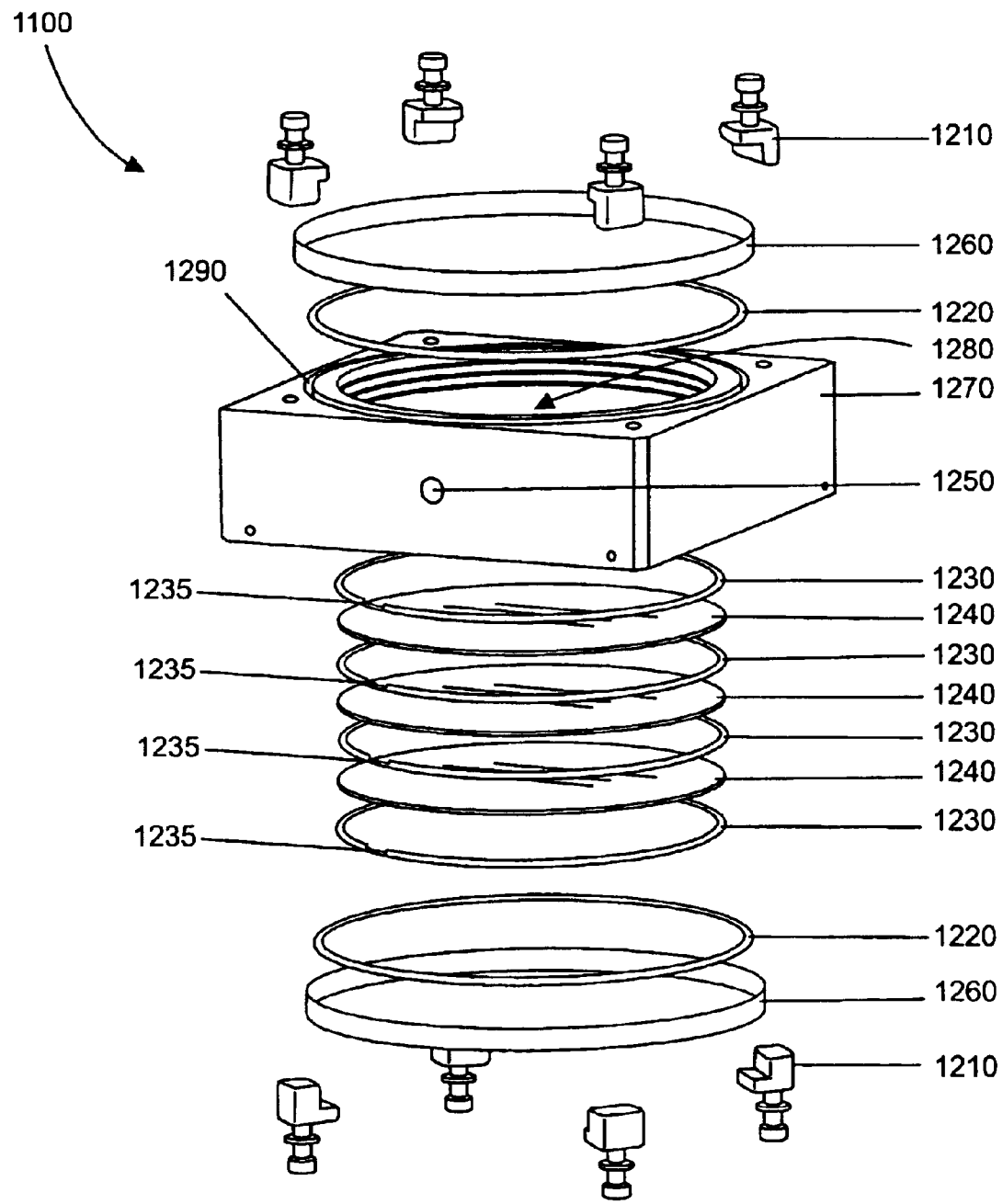
FIG. 13 is an exploded view of a vacuum chamber to be incorporated in a system for fluid filling wafer level cavities according to one exemplary embodiment.

The components of the simple vacuum filling chamber (1110) are shown in detail in FIGS. 12 and 13. As shown in FIG. 12, the alternative vacuum filling chamber (1110) includes a body block (1270) sealed on both ends by a glass substrate (1260). The glass substrates (1260) are coupled to the body block (1270) by a number of glass retainers (1210). Additionally, disposed between the glass substrates (1260) and the body block (1270) are a number of o-rings (1220) or other seals. The body block (1270) includes a vacuum orifice (1280) formed in the center thereof. The vacuum orifice (1280) is configured to facilitate the housing of multiple wafers (1240) separated by o-ring spacers (1230) having notches (1235) therein. A vacuum port (1250) is also disposed in the body block (1270) forming a lumen from the outer surface of the body block (1270) to the vacuum orifice (1280).

FIG. 13 illustrates an exploded view of the vacuum filling chamber (1110) according to one alternative embodiment. As shown in FIG. 13, the body block (1270) further includes an o-ring retention groove (1290), configured to seat and retain the o-rings (1220) or other seals used to form a vacuum tight seal in the vacuum orifice (1280).

Figure 14:
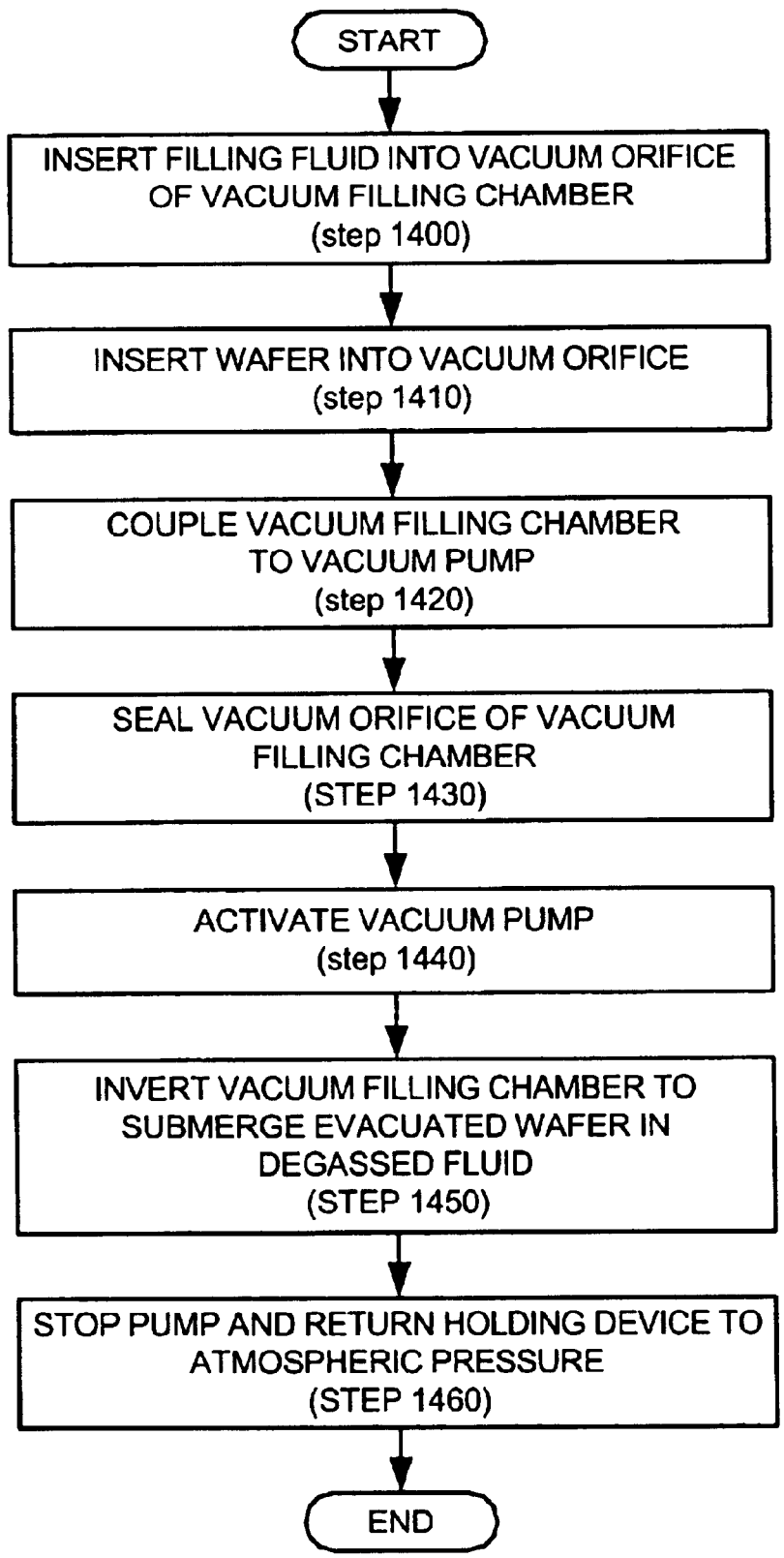
FIG. 14 illustrates a method for using a system for fluid filling wafer level cavities according to one exemplary embodiment.

FIG. 14 illustrates an exemplary method for operating the alternative fluid filling system (1100) illustrated in FIG. 11. According to FIG. 14, the alternative method begins by inserting degassed filling fluid into the vacuum orifice (1280; FIG. 12) of the vacuum filling chamber (step 1400). The degassed fluid may be placed and contained inside the vacuum orifice (1280; FIG. 12) by securing one glass substrate (1260; FIG. 12) to the bottom of the body block (1270; FIG. 12) with the glass retainers (1210; FIG. 12). Once the glass substrate is secured, degassed filling fluid may be placed within the vacuum orifice (1280).

Next, a number of wafers (1240; FIG. 12) may be inserted into the vacuum orifice (1280; FIG. 12) separated by a number of o-ring spacers (step 1410). An o-ring spacer (1230; FIG. 12) may be placed between each wafer (1240; FIG. 12) to allow filling fluid to access all outer surfaces of each wafer. The o-ring spacer (1230; FIG. 12) may include one or more notches (1235; FIG. 12) to allow for filling fluid to flow internal to the o-ring spacer.

Once the necessary materials have been inserted into the vacuum orifice (1280; FIG. 12), the vacuum orifice may be fluidly sealed by coupling the vacuum filling chamber (1110; FIG. 1) to the vacuum pump (step 1420) and coupling the second glass substrate (1260; FIG. 12) to the body block (step 1430). The vacuum filling chamber is coupled to the vacuum pump (1140; FIG. 11) by coupling the conduit (1130; FIG. 11) to the vacuum port (1250; FIG. 12). This connection allows the vacuum valve (1120; FIG. 11) to selectively couple the vacuum pump (1140; FIG. 11) to the vacuum filling chamber (1110; FIG. 1). Additionally, the vacuum orifice (1280; FIG. 12) is fluidly sealed by coupling the second glass substrate (1260; FIG. 12) to the top of the body block (step 1430). An o-ring (1220; FIG. 12) or other seal is disposed between the body block (1270; FIG. 12) and the glass substrate (1260; FIG. 12). When the glass substrate (1260; FIG. 12) is secured to the body block (1270; FIG. 12) by the glass retainers (1210; FIG. 12), the o-ring (1220; FIG. 12) is compressed, fluidly sealing the vacuum orifice (1280; FIG. 12).

Once the vacuum orifice (1280; FIG. 12) is sealed, the vacuum pump may be activated (step 1440). When the vacuum pump (1140; FIG. 11) is activated, it reduces the pressure in the conduit (1130; FIG. 11). This reduction in pressure associated with the activation of the vacuum pump (1140; FIG. 11) may be transferred to the vacuum orifice (1280; FIG. 12) by opening the vacuum valve (1120; FIG. 11). Once opened, the vacuum pump (1140; FIG. 11) creates a vacuum in the vacuum orifice (1280; FIG. 12) thereby evacuating air and/or gas from the wafer level cavities as well as further degassing the filling fluid. During this portion of the present method, the wafers (1240; FIG. 12) are held in place by the o-ring spacers (1230; FIG. 12).

When an appropriate vacuum has been created in the vacuum orifice (1280; FIG. 12), the vacuum filling chamber (1110; FIG. 11) may be inverted to submerge the evacuated wafers in degassed filling fluid (step 1450). The notches disposed in the o-ring spacers (1230; FIG. 12), allow the filling fluid to enter between and coat the surfaces of the evacuated wafers (1240; FIG. 12). However, as explained above with reference to FIG. 7, the filling fluid resists filling the wafer level cavities due to surface tension.

Once the wafers are coated by the filling fluid (step 1450), the vacuum pump may be stopped and the vacuum orifice (1280; FIG. 12) may be returned to atmospheric pressure (step 1460). When the vacuum orifice (1280; FIG. 12) is returned to atmospheric pressure, a pressure gradient exists, as explained above, causing the filling fluid to overcome the surface tension in the fluid and entering the wafer level cavities. Once returned to atmospheric pressure, the wafers (1240; FIG. 12) may be removed and excess filling fluid may be removed from the surfaces of the wafers (1240; FIG. 12).

According to this alternative embodiment, a small vacuum orifice (1280; FIG. 12) is used. This small orifice allows for the rapid pump down of the vacuum orifice (1280; FIG. 12), quick cycling, and reduced fluid consumption when compared to traditional methods. Additionally, the glass substrates implemented on each end of the vacuum filling chamber (1110; FIG. 11) allow for easy viewing of the wafer or wafers being filled.

Moreover, the consumption of fill fluid of the present alternative embodiment may be more efficient than traditional system's fluid consumption. Fill fluid consumption may be exceptionally efficient where the wafer or the vacuum chamber itself is spun, as is herein described, because the surfaces of the evacuated wafers may be coated with a minimal amount of evacuated filling fluid.

In conclusion, the present system and method for fluid filling wafer level packages incorporates an inexpensive vacuum chamber. Design of the vacuum chamber allows for rapid pump down, quick cycling, and reduced fluid consumption. Moreover, the present wafer filling vacuum chamber allows for easy disassembly and cleanup, thereby reducing the possibility of cross-contamination between filling fluids.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A system for fluid filling a wafer level packaging cavity comprising:
   a vacuum filling chamber configured to receive a wafer;
   a conduit coupled to said vacuum filling chamber; and
   a vacuum pump fluidly coupled to said vacuum filling chamber through said conduit, said vacuum pump being configured to create a vacuum within said wafer level packaging cavity;
   wherein said vacuum filling chamber comprises a body including a vacuum orifice, a first substrate sealingly coupled to said body to seal a first end of said vacuum orifice, and a second substrate sealingly coupled to said body to seal a second end of said vacuum orifice.

2. The system of claim 1, wherein said conduit is removably coupled to said vacuum filling chamber.

3. The system of claim 1, wherein said first substrate comprises a transparent substrate.

4. The system of claim 3, wherein said second substrate comprises a transparent substrate.

5. The system of claim 1, further comprising a vacuum valve coupled to said conduit, wherein said vacuum valve selectively couples said vacuum filling chamber and said vacuum pump.

6. The system of claim 1, further comprising a fluid degassing vacuum chamber fluidly coupled to said vacuum filling chamber and to said vacuum pump, wherein said fluid degassing vacuum chamber is configured to house a filling fluid while a degassing process is performed on said filling fluid.

7. The system of claim 6, further comprising:
   a degas valve coupled to said conduit, wherein said degas valve is configured to selectively couple said vacuum pump and said fluid degassing vacuum chamber; and
   a fluid fill valve coupled to said conduit, wherein said fluid fill valve is configured to selectively couple said fluid degassing vacuum chamber and said vacuum filling chamber.

8. The system of claim 1, wherein said vacuum filling chamber further comprises:
   a first seal disposed between said first substrate and said body; and
   a second seal disposed between said second substrate and said body;
   wherein said first seal and said second seal fluidly seal said vacuum filling chamber.

9. The system of claim 8, wherein said first seal and said second seal comprise o-rings.

10. The system of claim 1, further comprising a first lumen extending from said vacuum orifice to an outer surface of said vacuum filling chamber.

11. The system of claim 10, wherein said first lumen is configured to removably couple said vacuum orifice to said vacuum pump.

12. The system of claim 11, further comprising a second lumen extending from said vacuum orifice to an outer surface of said vacuum filling chamber, wherein said second lumen is configured to removably couple said vacuum orifice to a fluid degassing vacuum chamber.

13. The system of clam 1, further comprising:
   a plurality of o-ring spacers configured to separate a plurality of wafers;
   wherein said o-ring spacers include a number of channels, said channels being configured to allow for a flow of a filling fluid to an inner portion of said o-ring spacers.

14. The system of claim 1, wherein said first substrate and said second substrate comprise glass substrates.

15. The system of claim 1, further comprising a plurality of substrate retention brackets coupled to said body, said substrate retention brackets being configured to positionally fix said first substrate and said second substrate to said body.

16. The system of claim 15, wherein said substrate retention brackets are configured to removably couple said first and said second substrates to said body.

17. A system for fluid filling a wafer level packaging cavity comprising:
   a means for housing a wafer;
   a conduit removably coupled to said means for housing a wafer; and
   a means for creating a vacuum, said means for creating a vacuum being fluidly coupled to said means for housing a wafer through said conduit, said means for creating a vacuum being configured to create a vacuum within said wafer level packaging cavity;
   wherein said means for housing a wafer comprises a body including a vacuum orifice, and at least one substrate sealingly coupled to said body to seal said vacuum orifice.

18. The system of claim 17, wherein said at least one substrate comprises a transparent substrate.

19. The system of claim 17, further comprising a first means for valving coupled to said conduit between said means for housing a wafer and said means for creating a vacuum, wherein said means for valving selectively couples said means for housing a wafer and said means for creating a vacuum.

20. The system of claim 17, further comprising a means for degassing a fluid, said means for degassing a fluid being fluidly coupled to said means for housing a wafer and to said means for creating a vacuum, wherein said means for degassing a fluid is configured to house a filling fluid while a degassing process is performed on said filling fluid.

21. The system of claim 20, further comprising:
   a second means for valving coupled to said conduit between said means for creating a vacuum and said means for degassing a fluid, wherein said second means for valving is configured to selectively couple said means for creating a vacuum and said means for degassing a fluid; and
   a third means for valving coupled to said conduit between said means for degassing a fluid and said means for housing a wafer, wherein said third means for valving is configured to selectively couple said means for degassing a fluid and said means for creating a vacuum.

22. The system of claim 17, wherein said vacuum filling chamber further comprises a means for sealing disposed between said body and said at least one substrate, said means for sealing being configured to fluidly seal said vacuum filling chamber.

23. The system of claim 22, wherein said means for sealing comprises an o-ring.

24. The system of claim 17, further comprising a first lumen extending from said vacuum orifice to an outer surface of said means for housing a wafer.

25. The system of claim 24, wherein said first lumen is configured to removably couple said vacuum orifice to said means for creating a vacuum.

26. The system of claim 25, further comprising a second lumen extending from said vacuum orifice to an outer surface of said means for housing a wafer, wherein said second lumen is configured to removably couple said vacuum orifice to a means for degassing a fluid.

27. The system of clam 17, further comprising:
   a means for separating a plurality of wafers;
   wherein said means for separating a plurality of wafers include a number of channels, said channels being configured to allow for a flow of a filling fluid to an inner portion of said means for separating a plurality of wafers.

28. The system of claim 17, further comprising a means for retaining said at least one substrate, said means for retaining being configured to positionally fix said at least one substrate to said body.

29. The system of claim 28, wherein said means for retaining are configured to removably fix said substrate to said body.

30. A fluid filling vacuum chamber comprising:
   a body including a vacuum orifice configured to house a wafer during a wafer level packaging cavity fluid filling operation;
   at least one substrate sealingly coupled to said body, said at least one substrate being configured to fluidly seal said vacuum orifice; and
   a first lumen extending from said vacuum orifice to an outer surface of said fluid filling vacuum chamber.

31. The fluid filling vacuum chamber of claim 30, wherein said at least one substrate comprises a transparent substrate.

32. The fluid filling vacuum chamber of claim 30, wherein said first lumen is configured to removably couple said vacuum orifice to a vacuum pump.

33. The fluid filling vacuum chamber of claim 30, further comprising:
   a second lumen extending from said vacuum orifice to an outer surface of said fluid filling vacuum chamber;
   said second lumen being configured to removably couple said vacuum orifice to a degassed fluid source.

34. The fluid filling vacuum chamber of claim 30, wherein said at least one substrate further comprises a plurality of glass substrates configured to fluidly seal said vacuum orifice.

35. The fluid filling vacuum chamber of claim 30, further comprising:
   a seal seat disposed on a surface of said body; and
   a seal disposed in said seal seat between said at least one transparent substrate and said body.

36. The fluid filling vacuum chamber of claim 35, wherein said seal comprises an o-ring.

37. The fluid filling vacuum chamber of claim 30, further comprising a spacer configured to separate a plurality of wafers disposed in said vacuum chamber during a fluid filling operation.

38. The fluid filling vacuum chamber of claim 37, wherein said spacer further comprises an o-ring spacer including a number of channels, said channels being configured to allow a filling fluid to enter an inner portion of said o-ring spacers.

39. The fluid filling vacuum chamber of claim 30, further comprising a fastener configured to positionally secure said at least one transparent substrate to said body.

40. A means for fluidly filling wafer level packages comprising:
- a means for receiving a substrate, said means for receiving a substrate including a vacuum orifice;
- a means for fluidly sealing said vacuum orifice contained in said means for receiving a substrate; and
- a first lumen extending from said vacuum orifice to an outer surface of said means for fluidly filling wafer level packages.

41. The means for fluidly filling wafer level packages of claim 40, wherein said first lumen is configured to removably couple said vacuum orifice to a vacuum pump.

42. The means for fluidly filling wafer level packages claim 40, further comprising:
- a second lumen extending from said vacuum orifice to an outer surface of said means for fluidly filling wafer level packages;
- said second lumen being configured to fluidly couple said vacuum orifice to a degassed fluid source.

43. The means for fluidly filling wafer level packages of claim 40, wherein said means for fluidly sealing said vacuum orifice further comprises a plurality of glass substrates.

44. The means for fluidly filling wafer level packages of claim 40, further comprising:
- a seal seat disposed on a surface of said means for receiving a substrate; and
- a means for sealing disposed in said seal seat between said means for fluidly sealing said vacuum orifice and said means for receiving a substrate.

45. The means for fluidly filling wafer level packages of claim 44, wherein said means for sealing comprises an o-ring.

46. The means for fluidly filling wafer level packages of claim 40, further comprising means for separating a plurality of wafers disposed in said vacuum chamber during a fluid filling operation.

47. The means for fluidly filling wafer level packages of claim 46, wherein said means for separating further comprises an o-ring spacer including a number of channels, said channels being configured to allow a filling fluid to enter an inner portion of said o-ring spacers.

48. A method for fluid filling wafer level packages comprising:
- evacuating a gas from a wafer disposed in a vacuum chamber;
- introducing a degassed filling fluid to a surface of said wafer; and
- increasing a pressure in said vacuum chamber to create a pressure gradient between said vacuum chamber and a plurality of cavities on said surface of said wafer;
- wherein said pressure gradient is sufficient to overcome a surface tension force preventing said degassed filling fluid from entering said plurality of cavities.

49. The method of claim 48, wherein said evacuating a gas further comprises creating a vacuum in said vacuum chamber with a vacuum pump.

50. The method of claim 49, further comprising degassing a filling fluid with said vacuum pump.

51. The method of claim 50, wherein said filling fluid is degassed in a fluid degassing vacuum chamber that is fluidly coupled to said vacuum chamber.

52. The method of claim 51, wherein said introducing a degassed filling fluid to a surface of said wafer comprises:
- opening a fluid fill valve to permit said degassed filling fluid to enter said vacuum chamber; and
- permitting said degassed filling fluid to flow until said surface of said wafer is substantially covered with said degassed filling fluid.

53. The method of claim 50, wherein said filling fluid is degassed by the creation of said vacuum in said vacuum chamber.

54. The method of claim 53, wherein said introducing a degassed filling fluid to a surface of said wafer comprises rotating said vacuum chamber.

55. The method of claim 48, wherein said increasing a pressure in said vacuum chamber comprises re-introducing said gas into said vacuum chamber.

56. The method of claim 48, further comprising removing excess filling fluid from a surface of said wafer.

57. A method for making a fluid filling vacuum chamber comprising:
- forming a body including a vacuum orifice and a first lumen, said first lumen extending from said vacuum orifice to a surface of said body;
- wherein said vacuum orifice is configured to house a wafer during a fluid filling process, and said first lumen is configured to be removably coupled to an external vacuum pump; and
- sealingly coupling at least one transparent substrate to said body, wherein said at least one transparent substrate fluidly seals said vacuum orifice.

58. The method of claim 57, further comprising:
- forming a second lumen extending from said vacuum orifice to a surface of said body;
- wherein said second lumen is configured to be removably coupled to a fluid degassing vacuum chamber.

59. The method of claim 57, further comprising disposing a seal between said body and said at least one transparent substrate.

60. The method of claim 59, wherein said seal comprises an o-ring.

61. The method of claim 57, wherein said at least one transparent substrate comprises a first and a second glass substrate.

* * * * *